(12) United States Patent
Negley

(10) Patent No.: US 7,714,345 B2
(45) Date of Patent: May 11, 2010

(54) LIGHT-EMITTING DEVICES HAVING COPLANAR ELECTRICAL CONTACTS ADJACENT TO A SUBSTRATE SURFACE OPPOSITE AN ACTIVE REGION AND METHODS OF FORMING THE SAME

(75) Inventor: Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 235 days.

(21) Appl. No.: 10/818,592

(22) Filed: Apr. 6, 2004

(65) Prior Publication Data

US 2004/0217360 A1 Nov. 4, 2004

Related U.S. Application Data

(60) Provisional application No. 60/466,635, filed on Apr. 30, 2003.

(51) Int. Cl.
*H01L 27/15* (2006.01)
(52) U.S. Cl. ............ 257/99; 257/E33.062; 257/E33.066
(58) Field of Classification Search ................... 257/99, 257/E33.062, E33.066
See application file for complete search history.

(56) References Cited

U.S. PATENT DOCUMENTS

| 4,918,497 A | 4/1990 | Edmond | 257/77 |
| 4,966,862 A | 10/1990 | Edmond | 438/27 |
| 5,027,168 A | 6/1991 | Edmond | 257/103 |
| 5,210,051 A | 5/1993 | Carter, Jr. et al. | 438/22 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 438/45 |
| 5,631,190 A | 5/1997 | Negley | 438/33 |
| 5,739,554 A | 4/1998 | Edmond et al. | 257/103 |

(Continued)

FOREIGN PATENT DOCUMENTS

EP 1 079 444 A2 2/2001

(Continued)

OTHER PUBLICATIONS

International Search Report and Written Opinion for PCT US2004/011357, Dec. 9, 2004.

*Primary Examiner*—Allan R. Wilson
(74) *Attorney, Agent, or Firm*—Myers Bigel Sibley & Sajovec

(57) ABSTRACT

A light-emitting device includes a substrate having first and second opposing surfaces. An active region is on the first surface and first and second electrical contacts are adjacent to the second surface and are conductively coupled to the active region. In other embodiments, a light-emitting device includes a substrate having first and second opposing surfaces. An active region is on the first surface and includes a first active layer having a first conductivity type on the first surface and a second active layer having a second conductivity type on the first active layer. A first electrical contact is adjacent to the second surface. A contact plug extends through the substrate and the active region and couples the first electrical contact to the second active layer. A second electrical contact is coupled to the substrate at the second surface.

37 Claims, 5 Drawing Sheets

U.S. PATENT DOCUMENTS

| | | | |
|---|---|---|---|
| 5,767,581 A | 6/1998 | Nakamura et al. | 257/749 |
| 5,912,477 A | 6/1999 | Negley | 257/95 |
| 6,120,600 A | 9/2000 | Edmond et al. | 117/89 |
| 6,177,688 B1 | 1/2001 | Linthicum et al. | 257/77 |
| 6,187,606 B1 | 2/2001 | Edmond et al. | 438/46 |
| 6,201,262 B1 | 3/2001 | Edmond et al. | 257/77 |
| 6,303,485 B1 | 10/2001 | Sung et al. | 438/604 |
| 6,455,343 B1 * | 9/2002 | Chen et al. | 438/40 |
| 6,630,366 B2 * | 10/2003 | Taniguchi et al. | 438/34 |
| 6,657,236 B1 | 12/2003 | Thibeault et al. | 257/98 |
| 6,812,502 B1 * | 11/2004 | Chien et al. | 257/99 |
| 2002/0117681 A1 | 8/2002 | Weeks et al. | 257/106 |
| 2002/0121642 A1 | 9/2002 | Doverspike et al. | 257/97 |
| 2002/0123164 A1 | 9/2002 | Slater, Jr. et al. | 438/39 |
| 2002/0135069 A1 | 9/2002 | Wood et al. | 257/758 |
| 2003/0006418 A1 | 1/2003 | Emerson et al. | 257/79 |
| 2003/0222269 A1 * | 12/2003 | Lin et al. | 257/99 |
| 2004/0056260 A1 | 3/2004 | Slater, Jr. et al. | 257/79 |

FOREIGN PATENT DOCUMENTS

| | | |
|---|---|---|
| JP | 07030153 | 1/1995 |

* cited by examiner

LIGHT-EMITTING DEVICES HAVING COPLANAR ELECTRICAL CONTACTS ADJACENT TO A SUBSTRATE SURFACE OPPOSITE AN ACTIVE REGION AND METHODS OF FORMING THE SAME

RELATED APPLICATION

This application claims the benefit of and priority to U.S. Provisional Patent Application No. 60/466,635, filed Apr. 30, 2003, the disclosure of which is hereby incorporated herein by reference as if set forth in its entirety.

BACKGROUND OF THE INVENTION

The present invention relates generally to microelectronic devices and fabrication methods therefor, and, more particularly, to light-emitting devices and fabrication methods therefor.

Light-emitting diodes (LEDs) are widely used in consumer and commercial applications. As is well known to those skilled in the art, a light-emitting diode generally includes a diode region on a microelectronic substrate. The microelectronic substrate may comprise, for example, gallium arsenide, gallium phosphide, alloys thereof, silicon carbide, and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with well entrenched incandescent and fluorescent lamps.

Referring now to FIG. 1, a conventional GaN-based LED 100 comprises a substrate 105, such as sapphire ($Al_2O_3$) or SiC, that has first and second opposing surfaces 110a and 10b, respectively, and may be at least partially transparent to optical radiation. A diode region, comprising an n-type layer 115 and a p-type layer 120 is disposed on the second surface 110b and is configured to emit optical radiation upon application of a voltage across the diode region, for example across ohmic contacts 130 and 135.

The diode region including the n-type layer 115 and/or the p-type layer 125 may comprise gallium nitride-based semiconductor layers, including alloys thereof, such as indium gallium nitride and/or aluminum indium gallium nitride. The fabrication of gallium nitride on SiC is known to those skilled in the art, and is described, for example, in U.S. Pat. No. 6,177,688, the disclosure of which is hereby incorporated herein by reference. It will also be understood that a buffer layer or layers comprising aluminum nitride, for example, may be provided between the n-type gallium nitride layer 115 and the substrate 105, as described in U.S. Pat. Nos. 5,393,993, 5,523,589, 6,177,688, and application Ser. No. 09/154,363 entitled Vertical Geometry InGaN Light Emitting Diode, the disclosures of which are hereby incorporated herein by reference. The n-type gallium nitride layer 115 may comprise silicon-doped gallium nitride, while the p-type gallium nitride layer 120 may comprise magnesium-doped gallium nitride.

In some LEDs, the ohmic contact 135 for the p-type gallium nitride layer 120 comprises platinum, nickel and/or titanium/gold. In other LEDs, a reflective ohmic contact comprising, for example, aluminum and/or silver, may be used. The ohmic contact 130 to the n-type gallium nitride layer 115 may comprise aluminum and/or titanium. Other suitable materials that form ohmic contacts to p-type gallium nitride and n-type gallium nitride may be used for ohmic contacts 135 and 130, respectively.

Examples of ohmic contacts to n-type gallium nitride layers and p-type gallium nitride layers are described, for example, in U.S. Pat. No. 5,767,581, the disclosure of which is hereby incorporated herein by reference.

Unfortunately, LED devices that have coplanar electrical contacts on the active side (i.e., the diode region side) may use thicker diode regions than other vertical designed LEDs to reduce current crowding (i.e., forcing electrons to make sharp turns).

SUMMARY OF THE INVENTION

According to some embodiments of the present invention, a light-emitting device comprises a substrate having first and second Opposing surfaces. An active region is on the first surface and first and second electrical contacts are adjacent to the second surface and are conductively coupled to the active region. Advantageously, such configurations may allow electrical contacts to be coplanar on a non-active side of a substrate, which may obviate the need to use relatively thick active regions to reduce current crowding when electrical contacts are made coplanar on a non-active side of the substrate. As a result, more active devices may be formed on a single wafer.

In other embodiments of the present invention, a light-emitting device comprises a substrate having first and second opposing surfaces. An active region is on the first surface and comprises a first active layer having a first conductivity type on the first surface and a second active layer having a second conductivity type on the first active layer. A first electrical contact is adjacent to the second surface. A contact plug extends through the substrate and the active region and couples the first electrical contact to the second active layer. A second electrical contact is coupled to the substrate at the second surface.

In still further embodiments, a dielectric spacer is disposed between the contact plug and the substrate and between the contact plug and the first active layer. The dielectric spacer may comprise a material, such as spin-on-glass, a polyimide, silicon-dioxide, and/or silicon-nitride.

In still further embodiments, an ohmic contact layer is on the second active layer and the contact plug extends through the second active layer to contact the ohmic contact layer. The ohmic contact layer may comprise at least one of the following materials: TiN, platinum, nickel/gold, nickel oxide/gold, nickel oxide/platinum, Ti, and titanium/gold. The ohmic contact layer may also have a thickness between about 10 Å and about 100 Å and may be at least partially transparent.

In other embodiments, a buffer layer, which may comprise aluminum nitride, may be disposed between the active region and the substrate, such that the contact plug extends through the buffer layer.

In further embodiments, the substrate comprises a conductive material, such as SiC, and the contact plug comprises a conductive material, such as gold, silver, gold alloys, and/or silver alloys. The first electrical contact may comprise platinum, nickel, and/or titanium/gold. The second electrical contact may comprise aluminum and/or titanium.

Although described above primarily with respect to apparatus aspects of the present invention, methods of forming light-emitting devices are also described herein.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
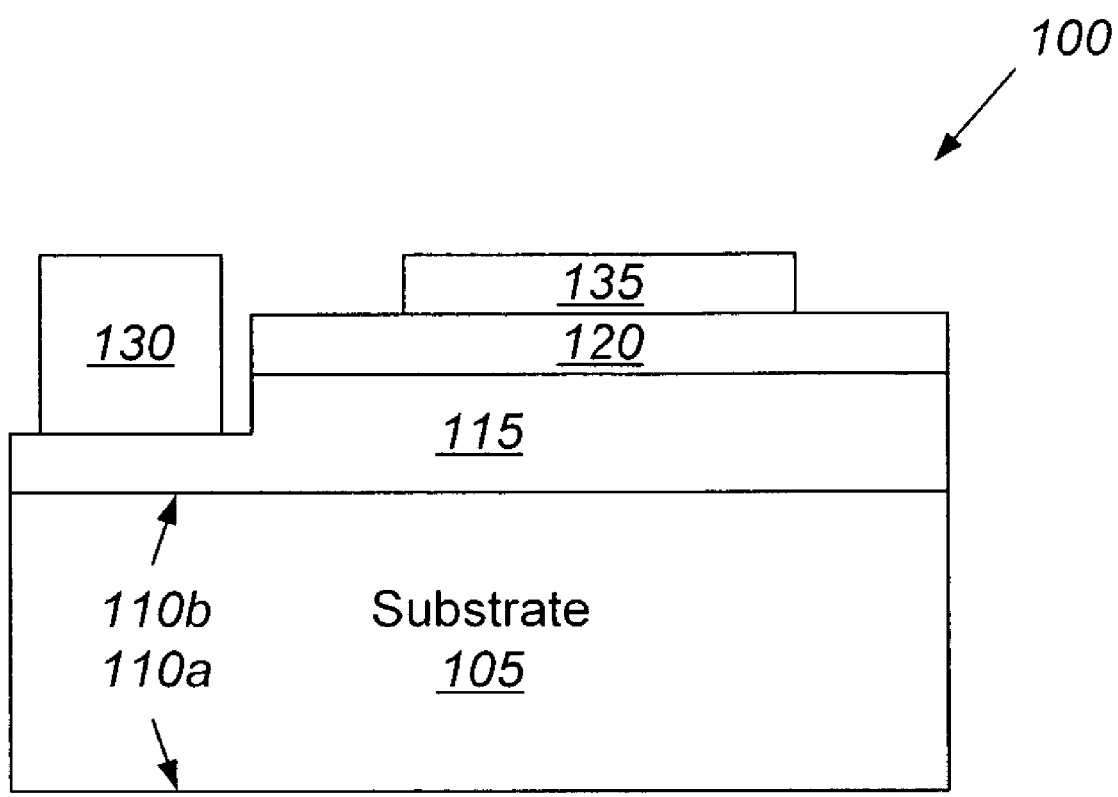
FIG. 1 is a cross-sectional diagram that illustrates a conventional GaN-based light-emitting diode (LED)

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. Each embodiment described herein also includes its complementary conductivity type embodiment.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second without departing from the teachings of the present invention.

Embodiments of the present invention will now be described, generally, with reference to GaN-based light-emitting diodes (LEDs) on SiC-based substrates. The present invention, however, is not limited to such structures. Embodiments of the invention may use other substrates including combinations, such as an AlGaInP diode on a GaP substrate, a GaN diode on a SiC substrate, an SiC diode on an SiC substrate, and/or a nitride-based diode on a gallium nitride, silicon carbide, aluminum nitride, zinc oxide and/or other substrate. Moreover, the present invention is not limited to the use of a diode region as an active region. Other types of active regions may also be used in accordance with some embodiments of the present invention.

Examples of light-emitting devices that may be used in embodiments of the present invention include, but are not limited to, the devices described in the following U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference. Other suitable LEDs and/or lasers are described in U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosures of which are incorporated herein as if set forth fully. Furthermore, phosphor coated LEDs, such as those described in U.S. patent application Ser. No. 10/659,241 entitled "PHOSPHOR-COATED LIGHT EMITTING DIODES INCLUDING TAPERED SIDEWALLS, AND FABRICATION METHODS THEREFOR," filed Sep. 9, 2003, the disclosure of which is incorporated by reference herein as if set forth full, may also be suitable for use in embodiments of the present invention.

The LEDs and/or lasers may be configured to operate in a "flip-chip" configuration such that light emission occurs through the substrate. In such embodiments, the substrate may be patterned so as to enhance light output of the devices as is described, for example, in U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosure of which is incorporated herein by reference as if set forth fully herein.

Figure 2A:
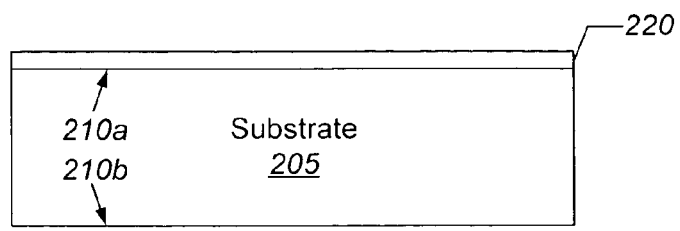
FIGS. 2A-2K are cross sectional diagrams that illustrate light-emitting devices and methods of forming same in accordance with various embodiments of the present invention.

Referring now to FIGS. 2A-2H, light-emitting devices and methods of forming same, in accordance with some embodiments of the present invention, will now be described. As shown in FIG. 2A, a substrate 205, such as, for example, a SiC substrate, is provided. The substrate 205 has a first surface 210a and a second surface 210b and may be at least partially transparent to optical radiation. A buffer layer or layers 220 comprising, for example, aluminum nitride may be formed on the first surface 210a of the substrate 205 as described in the above-incorporated U.S. Pat. Nos. 5,393,993, 5,523,589, 6,177,688, and application Ser. No. 09/154,363 entitled Vertical Geometry InGaN Light Emitting Diode.

Figure 2B:
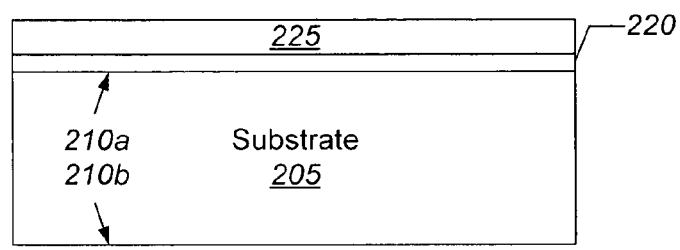
Figure 2C:
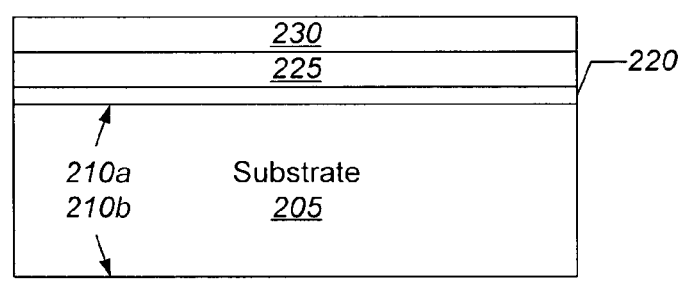

Referring now to FIGS. 2B and 2C, an active region, such as, for example, a diode region comprising an n-type layer 225 and a p-type layer 230 may be epitaxially grown on the buffer layer 220. The diode region, including the n-type layer 225 and/or the p-type layer 230 may comprise gallium nitride-based semiconductor layers, including alloys thereof, such as indium gallium nitride, aluminum gallium nitride, and/or aluminum indium gallium nitride. The fabrication of gallium nitride layers is described, for example, in the above-incorporated U.S. Pat. No. 6,177,688. The n-type gallium nitride layer 225 may comprise silicon-doped gallium nitride, while the p-type gallium nitride layer 230 may comprise magnesium-doped gallium nitride.

Figure 2D:
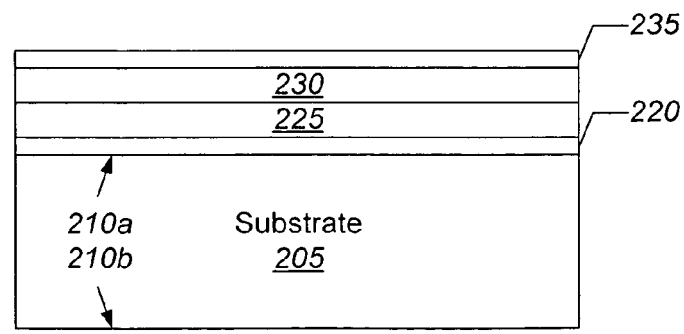

Referring now to FIG. 2D, an ohmic contact layer 235 may be formed on the p-type gallium nitride layer 230. In accordance with various embodiments of the present invention, the ohmic contact layer 235 may comprise TIN, platinum, nickel/gold, nickel oxide/gold, nickel oxide/platinum, Ti, titanium/gold and/or alloys thereof. The ohmic contact layer 235 may have a thickness between about 10 Å and about 100 Å and may be at least partially transparent to optical radiation in accordance with some embodiments of the present invention.

Figure 2E:
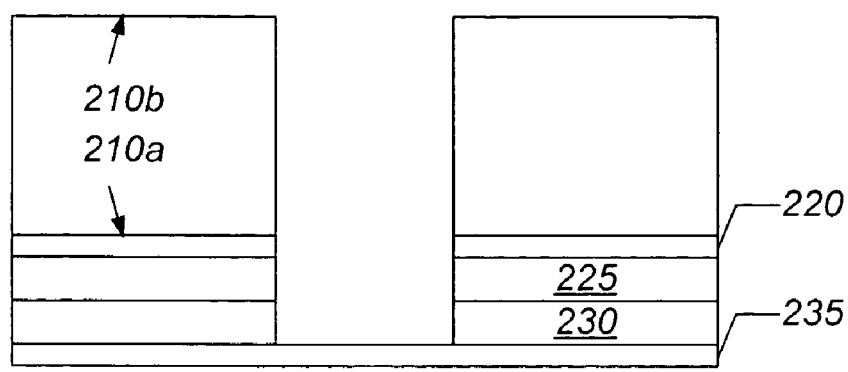

Referring now to FIG. 2E, a via is formed through the substrate 205, the buffer layer 220, and the diode region 225, 230. In some embodiments, the via may be formed by etching the substrate 205, the buffer layer 220, and the diode region 225, 230 using the ohmic contact layer 235 as an etch stop layer. Various etching techniques may be used in accordance with different embodiments of the present invention, including, but not limited to, wet etching, dry etching, and micro-machining.

Figure 2F:
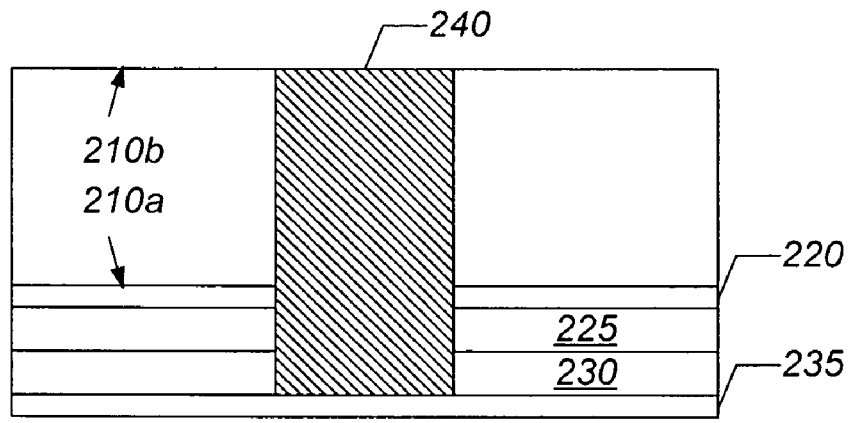
Figure 2G:
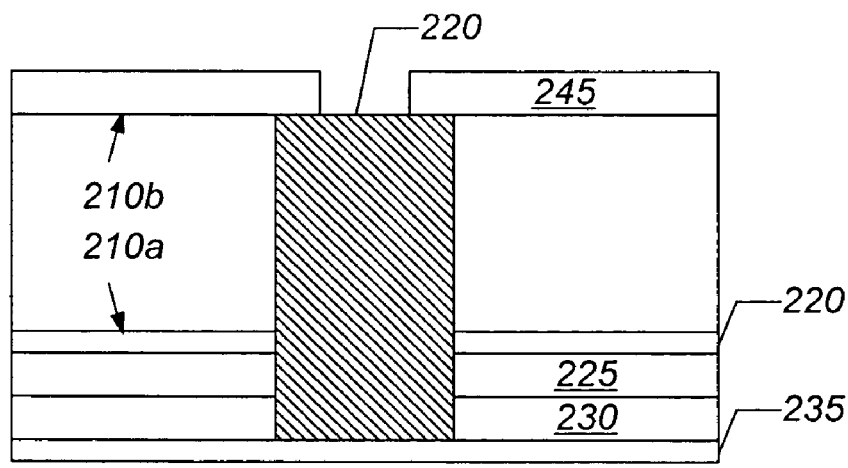
Figure 2H:
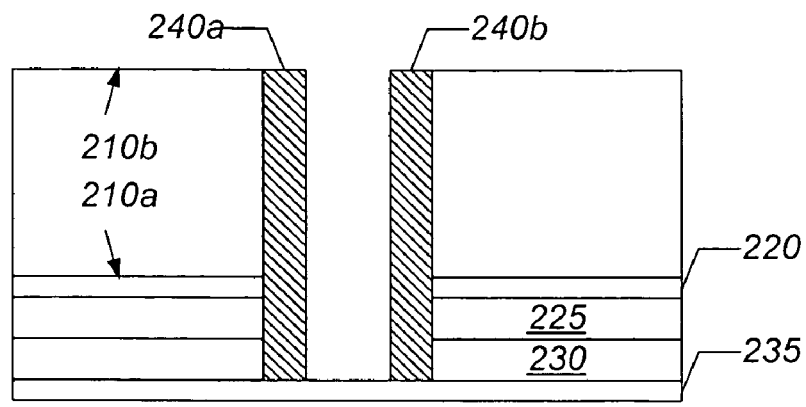

Referring now to FIGS. 2F-2H, exemplary operations for forming a dielectric spacer on sides of the via will now be described. As shown in FIG. 2F, the via is at least partially filled with a dielectric material 240. By using, for example, sol-gel technology, spin-on-glass, a polyimide material, silicon dioxide and/or silicon nitride the dielectric material 240 may be formed in the via in the liquid state and later etched after curing to a solid. A mask 245 is formed on the second surface 210b of the substrate 205 and patterned so as to expose a portion of the dielectric material 240 as shown in FIG. 2G. Referring now to FIG. 2H, the dielectric material 240 is etched through the mask 245 so as to leave a dielectric spacer 240a and 240b on sides of the via. Various etching techniques may be used in accordance with different embodiments of the present invention, including, but not limited to, wet etching, dry etching, and micro-machining.

Figure 2I:
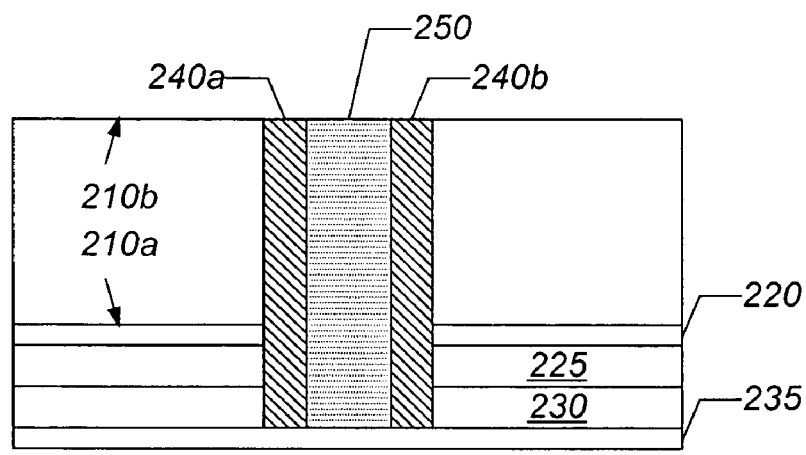

Referring now to FIG. 2I, a contact plug 250 is formed in the via by, for example, plating the via with a conductive material, such as gold, silver, gold alloys, and/or silver alloys, in accordance with some embodiments of the present invention.

Figure 2J:
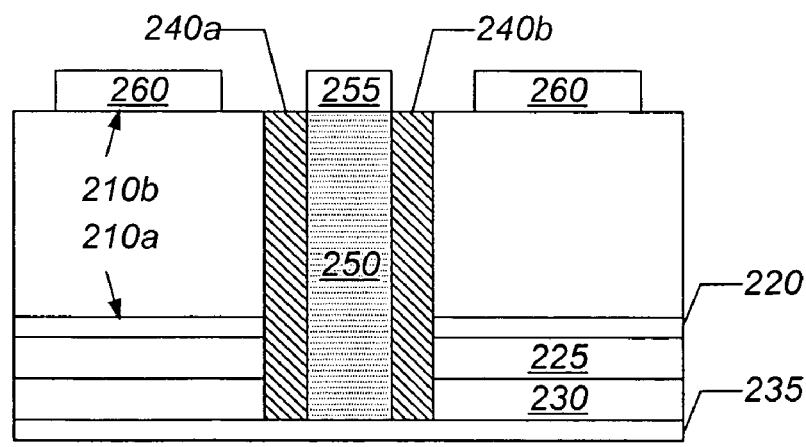

Referring now to FIG. 2J, a first electrical contact 255 is formed adjacent to the second surface 210b such that the contact plug 250 couples the first electrical contact 255 to the p-type gallium nitride layer 230 via the ohmic contact layer 235. Advantageously, because the ohmic contact layer 235 contacts the p-type gallium nitride layer 230 across a relatively broad surface area, improved current spreading may be provided. The first electrical contact 255 for the p-type gallium nitride layer 230 may comprise platinum, nickel, titanium/gold and/or alloys thereof. In other embodiments, a reflective ohmic contact comprising, for example, alumilium and/or silver, may be used to implement the first electrical contact 255.

Figure 2K:
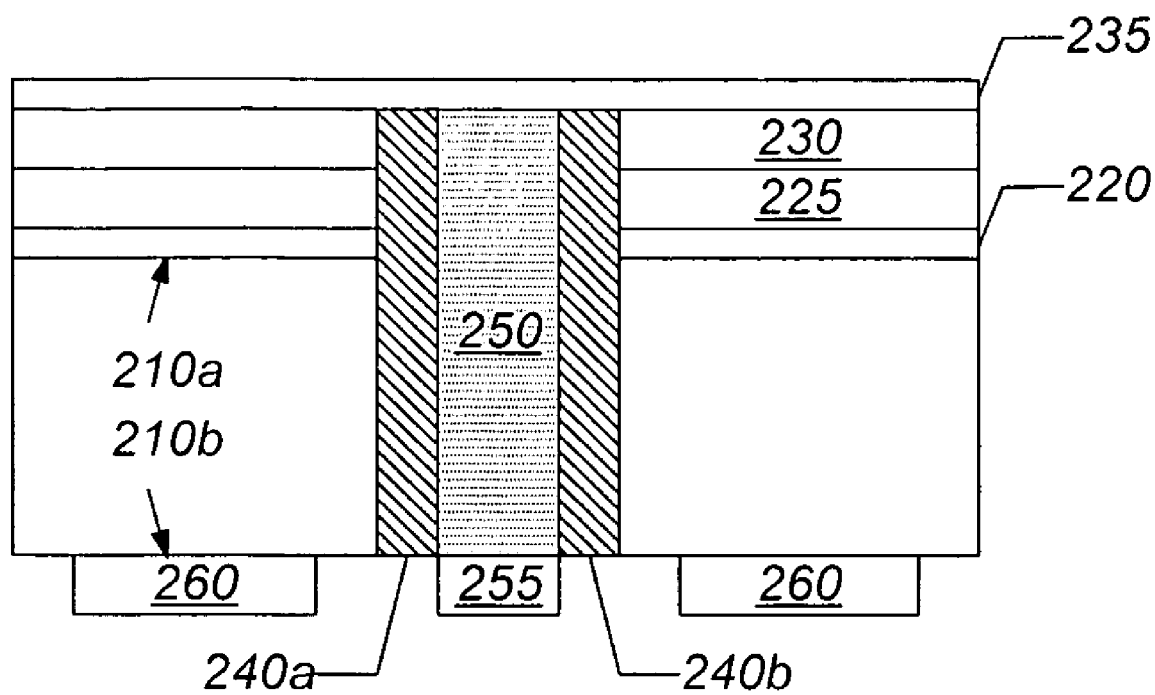

As shown in FIG. 2J, one or more second electrical contact(s) 260 are formed on the second surface 210b of the substrate 205. The second electrical contact(s) 260 for the n-type gallium nitride layer 225 may comprise aluminum, titanium and/or alloys thereof. Other suitable materials that form ohmic contact to n-type gallium nitride may be used for the second electrical contact(s) 260. Examples of ohmic contacts to n-type gallium nitride layers and p-type gallium nitride layers are described, for example, in the above-incorporated U.S. Pat. No. 5,767,581. FIG. 2K shows the structure of FIG. 2J inverted with the diode region on top of the substrate 205.

Advantageously, light-emitting devices, according to some embodiments of the present invention, may allow electrical contacts to be coplanar on a non-active side of a substrate, which may obviate the need to use relatively thick diode regions to reduce current crowding when electrical contacts are made coplanar on the active side of the substrate. As a result, more active devices may be formed on a single wafer.

Embodiments of the invention have been described above in which a diode is shown as an example of an active region. It should be understood, however, that an active region may include, but is not limited to, quantum wells, heterojunctions, homojunctions, multiple layers, combinations of the foregoing, or the like, in accordance with some embodiments of the present invention. For example, layers 225 and 230 may be embodied as described in the above-referenced patents and/or applications. Moreover, additional layers, such as lattice strain layers, may also be incorporated in light-emitting devices in accordance with further embodiments of the present invention.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A light-emitting device, comprising:
   first and second opposing surfaces of a layer;
   an active region comprising a first active layer having a first conductivity type on the first surface and a second active layer having a second conductivity type on the first active layer;
   a first electrical contact adjacent to the second surface;
   a partially transparent current spreading layer on the second active layer;
   a contact plug that is substantially non-adjacent an edge of the active region and extending through the active region to contact the current spreading layer so as to couple the first electrical contact to the second active layer; and
   a second electrical contact that is coupled to the second surface without extending through the second surface,
   wherein the current spreading layer forms an ohmic contact with the second active layer, and
   wherein the ohmic contact comprises a reflective ohmic contact.

2. The light-emitting device of claim 1, further comprising a dielectric spacer on sides of the contact plug that separate the contact plug from the first active layer and in contact with the current spreading layer,
   wherein the dielectric spacer comprises spin-on-glass and/or a polyimide.

3. The light-emitting device of claim 1, wherein the ohmic contact layer comprises at least one of TiN, platinum, nickel/gold, nickel oxide/gold, nickel oxide/platinum, Ti, and titanium/gold.

4. The light-emitting device of claim 3, wherein the ohmic contact layer has a thickness between about 10 Å and about 100 Å.

5. The light-emitting device of claim 1, further comprising:
   a buffer layer adjacent the active region, the contact plug extending through the buffer layer.

6. The light-emitting device of claim 5, wherein the buffer layer comprises aluminum nitride.

7. The light-emitting device of claim 1, further comprising a substrate comprising the first and second opposing surfaces, wherein the substrate comprises SiC.

8. The light-emitting device of claim 1, wherein the contact plug comprises gold, silver, a gold alloy, and/or a silver alloy.

9. The light-emitting device of claim 1, wherein the first conductivity type is n-type, and wherein the second electrical contact comprises at least one of aluminum and titanium.

10. The light-emitting device of claim 1, wherein the second conductivity type is p-type, and wherein the first electrical contact comprises at least one of platinum, nickel, and titanium/gold.

11. The light-emitting device of claim 1, wherein the first active layer comprises GaN.

12. The light-emitting device of claim 1, wherein the second active layer comprises GaN.

13. A light-emitting device, comprising:
first and second opposing surfaces of a layer;
an active region on the first surface, the active region including a first active layer having a first conductivity type on the first surface and a second active layer having a second conductivity type on the first active layer;
a partially transparent current spreading layer on the second active layer of the active region, the current spreading layer including a reflective ohmic contact that is substantially non-adjacent an edge of the active region; and
first and second electrical contacts adjacent to the second surface that are conductively coupled to the active region, at least one of the first and second electrical contacts being disposed on the second surface without extending through the substrate.

14. The light-emitting device of claim 13, further comprising
a contact plug extending through the active region to contact the current spreading layer so as to couple the first electrical contact to the second active layer.

15. The light-emitting device of claim 14, further comprising:
a dielectric spacer on sides of the contact plug that separate the contact plug from the first active layer.

16. The light-emitting device of claim 15, wherein the dielectric spacer comprises spin-on-glass and/or a polyimide.

17. The light-emitting device of claim 13, wherein the reflective ohmic contact layer comprises at least one of nickel oxide/gold and nickel oxide/platinum.

18. The light-emitting device of claim 17, wherein the reflective ohmic contact layer has a thickness between about 10 Å and about 100 Å.

19. The light-emitting device of claim 14, further comprising:
a buffer layer between the active region and the first surface, the contact plug extending through the buffer layer.

20. The light-emitting device of claim 19, wherein the buffer layer comprises aluminum nitride.

21. The light-emitting device of claim 14, wherein the contact plug comprises gold, silver, a gold alloy, and/or a silver alloy.

22. The light-emitting device of claim 13, wherein the first conductivity type is n-type, and wherein the second electrical contact comprises at least one of aluminum and titanium.

23. The light-emitting device of claim 13, wherein the second conductivity type is p-type, and wherein the first electrical contact comprises at least one of platinum, nickel, and titanium/gold.

24. The light-emitting device of claim 13, wherein the first active layer comprises GaN.

25. The light-emitting device of claim 13, wherein the second active layer comprises GaN.

26. The light-emitting device of claim 13, further comprising a substrate comprising the first and second opposing surfaces, wherein the substrate comprises SiC.

27. A method of forming a light-emitting device, comprising:
forming an active region on a first surface of first and second opposing surfaces of a layer;
forming a partially transparent current spreading layer on the active region, the current spreading layer including a reflective ohmic contact with the active region, wherein the reflective ohmic contact is substantially non-adjacent an edge of the active region;
forming first and second electrical contacts adjacent to the second surface that are conductively coupled to the active region such that at least one of the first and second electrical contacts is disposed on the second surface without extending through the active region.

28. The method of claim 27, wherein forming the active region comprises:
forming a first active layer having a first conductivity type on the first surface and;
forming a second active layer having a second conductivity type on the first active Layer; and
wherein forming the current spreading layer comprises forming the current spreading layer on the second active layer.

29. The method of claim 28, further comprising:
forming a contact plug extending through the active region to contact the current spreading layer so as to couple the first electrical contact to the second active layer.

30. The method of claim 29, further comprising:
forming a dielectric spacer on sides of the contact plug that separate the contact plug from the first active layer.

31. The method of claim 29, further comprising:
forming a buffer layer between the active region and a substrate that includes the first and second opposing surfaces, the contact plug extending through the buffer layer.

32. A light-emitting device, comprising:
a flat planar surface defining a planar surface area and comprising first and second contact surfaces;
an active region on the flat planar surface, the active region including a first active layer having a first conductivity type and a second active layer on the first active layer having a second conductivity type;
a current spreading layer on the second active layer of the active region;
a contact plug that is substantially non-adjacent an edge of the active region and that extends through the active region to contact the current spreading layer, the contact plug comprising the first contact surface;
a first electrical contact that is within the planar surface area, the first electrical contact on the first contact surface and adjacent the second contact surface, the first electrical contact conductively coupled to the second active layer through the current spreading layer via the contact plug; and
a second electrical contact that is within the planar surface area, the second electrical contact on the second contact surface and conductively coupled to the first active layer.

33. A device according to claim 32, wherein the current spreading layer is at least partially transparent.

34. A device according to claim 33, wherein the current spreading layer comprises a reflective ohmic contact with the second active layer.

35. A device according to claim 32, wherein the reflective ohmic contact comprises at least one of nickel oxide/gold and nickel oxide/platinum.

36. A device according to claim 32, further comprising a dielectric spacer on sides of the contact plug that separate the contact plug from the first active layer.

37. A device according to claim 36, wherein the dielectric spacer comprises spin-on-glass and/or a polyimide.

* * * * *